United States Patent [19]

Lucas

[11] Patent Number: 4,554,575

[45] Date of Patent: Nov. 19, 1985

[54] LOW STRESS LEADLESS CHIP CARRIER AND METHOD OF ASSEMBLY

[75] Inventor: Michael R. Lucas, Arbutus, Md.

[73] Assignee: Westinghouse Electric Corp., Pittsburgh, Pa.

[21] Appl. No.: 493,903

[22] Filed: May 12, 1983

[51] Int. Cl.[4] .................... H01L 23/14; H01L 23/10; H01L 23/34

[52] U.S. Cl. ........................ 357/80; 357/65; 357/81; 174/68.5

[58] Field of Search ...................... 357/65, 80, 74, 68, 357/81; 174/68.5

[56] References Cited

U.S. PATENT DOCUMENTS

| | | | |
|---|---|---|---|
| 4,332,341 | 1/1982 | Minetti | 357/68 |
| 4,366,342 | 12/1982 | Breedlove | 357/70 |
| 4,383,363 | 5/1973 | Hayakawa et al. | 174/68.5 |

FOREIGN PATENT DOCUMENTS

| | | | |
|---|---|---|---|
| 2741417 | 3/1978 | Fed. Rep. of Germany | 174/68.5 |
| 52-30382 | 3/1977 | Japan | 357/74 A |
| 54-131871 | 10/1979 | Japan | 357/80 |

OTHER PUBLICATIONS

"Adhesive–Metal Shim Module Capping Technique", Dunn et al., IBM Technical Disclosure Bulletin, vol. 25, No. 4, Sep. 1982, p. 1841/2.

"Use of Metal Core Substrates for Leadless Chip Carrier Interconnection"—Lassen—Electronic Packaging and Production, vol. 21, No. 3, (Mar. 1980), p. 98/104.

"Chip-Package Substrate Cushions Dense, High Speed Circuitries"—Electronics, Jul. 14, 1982.

Primary Examiner—William D. Larkins
Assistant Examiner—Sheila V. Clark
Attorney, Agent, or Firm—W. G. Sutcliff

[57] ABSTRACT

A leadless integrated circuit chip carrier apparatus and method of assembly to a printed circuit board. A plurality of castellations are provided in the perimeter walls of the carrier member and solder preforms are deformably fitted in the castellations for reflow vapor phase soldering to the printed circuit board. A spacer member is disposed between the carrier member and the printed circuit board and has a thermal coefficient of expansion matched to that of the solder. The spacer includes a high thermal conductivity planar metal portion sandwiched between an adhesive epoxy layer which facilitates assembly of the carrier to the circuit board.

3 Claims, 2 Drawing Figures

LOW STRESS LEADLESS CHIP CARRIER AND METHOD OF ASSEMBLY

BACKGROUND OF THE INVENTION

The present invention relates to integrated circuit assembly and packaging, and more particularly to the mounting of leadless integrated circuit chip carriers upon a printed circuit board.

The most widely utilized integrated circuit package presently is the dual-in-line package where the electrical leads extend from the package in two aligned parallel arrays from opposed sides of the package. The electrical leads extend downward to permit insertion into and connection with printed circuit board mounting holes. These electrical leads are subject to distortion during handling and can create problems in automated assembly systems.

A more recent package for such integrated circuit chips is the leadless chip carrier, in which the IC chip is mounted on one side of an insulating chip carrier with generally planar electrical connections between the chip periphery leads and a conductor pattern on the carrier. The chip carrier carries the conductor pattern to the opposite side of the carrier, typically by way of a plurality of castellations formed in the perimeter of the chip carrier, and with the conductor pattern extending down along the castellations. The leadless chip carrier is then aligned over the mounting pads or conductor pattern on the printed circuit board and soldered thereto.

The present techniques for attaching the leadless carrier to the printed circuit board substrate and making electrical connection include the screening of solder paste on the substrate, placing the carrier in the solder paste, and reflowing the solder by vapor phase reflow process. The carriers can be pretined and then placed in screened on solder paste on the substrate and the solder reflowed.

In general, prior art techniques for mounting leadless chip carriers have been found inadequate. The solder connection at the carrier perimeter is the primary thermal conduction path from the IC chip to the mounting substrate since the carrier is spaced above the substrate by the height of the solder connection. This provides a substantial lateral thermal path from the IC during operation to the substrate, which may have cooling fins on the opposed substrate surface.

It is also difficult to control the amount of solder which forms the electrical connection between the carrier conductor pattern and the printed circuit board conductor pattern. Differing amounts of solder tend to be applied to portions of the carrier, and a limited amount of solder can be applied which results in the leadless carrier being spaced above the substrate by a small distance which is the height of the solder. When there is a mismatch in thermal expansion between the leadless carrier and the substrate, significant stress is generated in the solder joint which can result in fatigue and cracking after numerous thermal cycles.

It is difficult to maintain the leadless carrier in proper alignment with the substrate conductor during vapor phase reflow soldering since the vapor as it condenses on the substrate can float the carrier, permitting its movement from the desired aligned location.

SUMMARY OF THE INVENTION

The present invention is a leadless carrier structure and method of assembly which provides a short, direct thermal path between the carrier and the substrate, and provides low stress solder connections between the carrier and the printed circuit board.

The leadless chip carrier includes a plurality of castellations or arcuate portions in the perimeter walls of the insulator body of the carrier, with solder preforms provided in these carrier castellations which are to be aligned with and electrically connected to the substrate conductive pattern on the circuit board. A spacer of predetermined thickness is disposed on the underside of the carrier. The spacer comprises a high thermal conductivity planar metal portion sandwiched between adhesive layers which are used to attach the spacer to the underside of the carrier and to the substrate. The spacer thickness is selected to provide a solder connection between the carrier and the substrate of a height such that stress in the solder connection is minimized. The spacer serves as an efficient thermal conduction path from the carrier to the substrate.

DESCRIPTION OF THE PREFERRED EMBODIMENT

Figure 1:
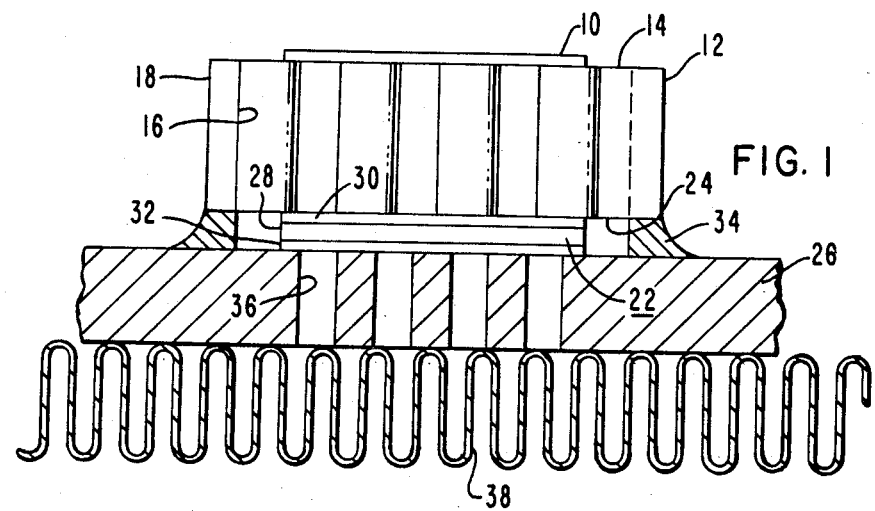
FIG. 1 is a side elevation view showing a leadless chip carrier assembled per the present invention to a printed circuit board with thermal conduction means.

The invention can be understood by reference to the exemplary embodiment seen in the drawings. In FIG. 1, an integrated circuit (IC) chip 10 is mounted on a leadless chip carrier 12. The carrier 12 is an insulating body with the chip 10 mounted on the top surface 14 of the carrier. A plurality of arcuate side wall portions or castellations 16 are formed in the perimeter walls 18 of the carrier. A conductor pattern 13 is provided on the top surface 14 of the carrier, with the chip periphery lead pattern electrically connected to the carrier conductor pattern as by soldering.

Figure 2:
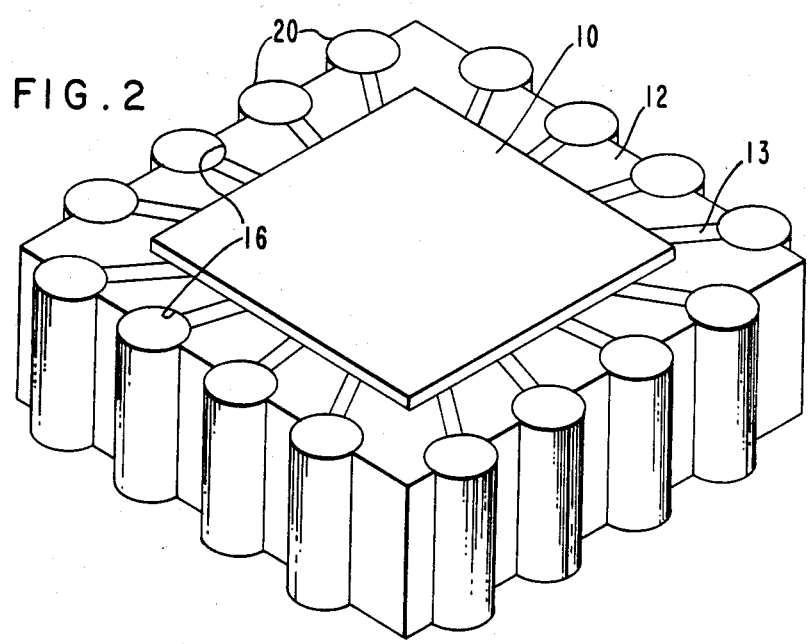
FIG. 2 is an enlarged perspective view of the carrier illustrating the solder preforms fitted in the perimeter wall castellations.

As seen in FIG. 2, prior assembly of the chip carrier on the printed circuit board, solder preforms 20 are fitted into the carrier castellations 16. The solder preforms 20 may be cylindrical bodies which are force fitted and held in place by deformation of the solder preform.

A spacer means 22 is disposed between the bottom surface 24 of the carrier 12 and the printed circuit board substrate 26. The spacer means 22 comprises a high thermal conductivity planar metal layer 28 sandwiched between adhesive epoxy layers 30 and 32. When the carrier 12 is properly aligned over the printed circuit board substrate with the spacer means therebetween, the respective epoxy layers 30 and 32 are cured to attach layer 30 to the carrier, and layer 32 to the substrate 26. This mechanically fixes the carrier in place with the spacer means 22 defining a predetermined dimension between the carrier and the substrate. This predetermined dimension is selected to provide the desired solder connection height or thickness which minimizes thermally induced stress in the solder connection. The spacer thickness is preferably about 0.015 inch, and following reflow of the solder preforms, the solder connections 34 of the height exhibit significantly reduced shear stress. The spacer means thermal expansion is made approximately equal to that of the solder.

By way of example, the solder preforms are conventional 63 percent tin - 37 percent lead low-temperature solder. The spacer, by way of example, comprises a 0.010 inch thick metal layer of aluminum, beryllium-copper, or copper clad iron, with the layer of epoxy on both sides. The total spacer thickness is about 0.015 inch thick including both epoxy layers. Conventional epoxy materials were utilized.

A plurality of plated through holes 36 are provided through the substrate 26 to facilitate thermal conduction to the fin stock heat exchange means 38 provided on the underside of the substrate 26. An efficient thermal conduction path is provided from the chip through the carrier and thermally conductive spacer, and through the substrate to the heat exchange means.

What we claim is:

1. An integrated circuit chip carrier for mounting and electrically connecting the integrated circuit chip to a printed circuit board conductor pattern, which carrier comprises a leadless carrier member having a conductive path disposed on a top surface with the integrated circuit chip mounted on this top surface with chip contacts electrically connected to the conductive path, and wherein a plurality of castellations are provided in the perimeter walls of the carrier with reflowed solder conductor means extending along the castellated perimeter wall portions and electrically connecting the carrier top surface conductive path with the printed circuit board conductor pattern and a spacer member is disposed between the under surface of the leadless carrier member and the printed circuit board, which spacer member comprises a high thermal conductivity planar metal portion sandwiched between adhesive insulating layers on either side of the planar metal portion which spacer member is about 0.015 inch thick, with solder connections extending between the printed circuit board and the carrier castellations, with the thermal expansion coefficient for the spacer matched to that of the solder and the thickness of the spacer member defining a solder connection height providing a low stress solder connection.

2. The integrated circuit chip carrier set forth in claim 1, mounted on and electrically connecting the chip to the conductive portion of a printed circuit board, wherein a plurality of apertures are provided through the printed circuit board beneath the spacer, with thermally conductive material plated in such apertures.

3. The integrated circuit chip carrier set forth in claim 2, wherein heat exchange means are provided on the side of the printed circuit board opposed to the side upon which the chip carrier is disposed.

* * * * *